United States Patent
Park et al.

(10) Patent No.: US 8,748,327 B2
(45) Date of Patent: Jun. 10, 2014

(54) LEAD FREE GLASS FRIT POWDER FOR MANUFACTURING SILICON SOLAR CELL, ITS PRODUCING METHOD, METAL PASTE COMPOSITION CONTAINING THE SAME AND SILICON SOLAR CELL

(71) Applicant: LG Chem, Ltd., Seoul (KR)

(72) Inventors: Jong-Wuk Park, Gyeonggi-do (KR);
Min-Seo Kim, Daejeon (KR);
Jong-Taik Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/679,814

(22) Filed: Nov. 16, 2012

(65) Prior Publication Data
US 2013/0087746 A1    Apr. 11, 2013

Related U.S. Application Data

(60) Division of application No. 12/961,934, filed on Dec. 7, 2010, now abandoned, which is a continuation of application No. PCT/KR2009/004421, filed on Aug. 7, 2009.

(51) Int. Cl.
C03C 8/02 (2006.01)
C03C 8/04 (2006.01)
C03C 8/18 (2006.01)

(52) U.S. Cl.
USPC ............................ 501/19; 501/26; 252/514

(58) Field of Classification Search
CPC .............. C03C 8/02; C03C 8/04; C03C 8/18; H01B 1/16; H05K 1/092
USPC ....................................... 252/514; 501/19, 26
See application file for complete search history.

(56) References Cited

U.S. PATENT DOCUMENTS

| | | | |
|---|---|---|---|
| 4,220,547 A | 9/1980 | Abe et al. | |
| 5,252,521 A | 10/1993 | Roberts | |
| 5,378,408 A * | 1/1995 | Carroll et al. | 252/514 |
| 5,468,695 A * | 11/1995 | Carroll et al. | 501/79 |
| 6,592,974 B2 * | 7/2003 | Miki et al. | 428/210 |
| 6,624,104 B2 | 9/2003 | Sakoske et al. | |
| 6,936,556 B2 | 8/2005 | Sridharan et al. | |
| 7,267,713 B2 * | 9/2007 | Adachi | 106/13 |
| 7,438,829 B2 | 10/2008 | Cho et al. | |
| 7,560,401 B2 | 7/2009 | Prunchak et al. | |
| 7,740,899 B2 | 6/2010 | Sridharan et al. | |

(Continued)

FOREIGN PATENT DOCUMENTS

| | | | |
|---|---|---|---|
| JP | 2006315875 | * | 11/2006 |
| JP | 2008-117790 A | | 5/2008 |
| JP | 2008-297199 A | | 12/2008 |
| KR | 100856681 B2 | | 8/2008 |

*Primary Examiner* — Karl Group
(74) *Attorney, Agent, or Firm* — McKenna Long & Aldridge, LLP

(57) ABSTRACT

Disclosed are lead free glass frit powder for manufacturing a silicon solar cell, its producing method, a metal paste composition containing the same and a silicon solar cell. The lead free glass frit powder for manufacturing a silicon solar cell includes $Bi_2O_3$; $B_2O_3$; and any one metal oxide selected from the group consisting of ZnO, $Al_2O_3$ and $BaCO_3$, or mixtures thereof. The glass frit powder is free of lead, and thus, it is environmental friendly. A front electrode of a solar cell formed using the glass frit powder has low resistance against contact with a substrate and high adhesion to the substrate.

2 Claims, 4 Drawing Sheets

(56) References Cited

U.S. PATENT DOCUMENTS

| | | | |
|---|---|---|---|
| 8,007,690 B2 * | 8/2011 | Yamakawa et al. | 252/512 |
| 2004/0003836 A1 | 1/2004 | Watsuji et al. | |
| 2004/0018931 A1 | 1/2004 | Sridharan et al. | |
| 2006/0289055 A1 | 12/2006 | Sridharan et al. | |
| 2008/0254567 A1 | 10/2008 | Konno | |
| 2009/0004369 A1 * | 1/2009 | Inaba et al. | 427/99.2 |
| 2010/0308462 A1 * | 12/2010 | Konno et al. | 257/741 |
| 2011/0146776 A1 * | 6/2011 | Carroll et al. | 136/256 |

\* cited by examiner

LEAD FREE GLASS FRIT POWDER FOR MANUFACTURING SILICON SOLAR CELL, ITS PRODUCING METHOD, METAL PASTE COMPOSITION CONTAINING THE SAME AND SILICON SOLAR CELL

This application is a Divisional of U.S. patent application Ser. No. 12/961,934, filed Dec. 7, 2010, which is a Continuation of PCT/KR2009/004421, filed on Aug. 7, 2009, all of which are hereby incorporated by reference in their entirety.

BACKGROUND OF THE INVENTION

1. Field of the Invention

The present invention relates to lead free glass frit, powder for manufacturing a silicon solar cell, its producing method, a metal paste composition comprising the same and a silicon solar cell, and in particular, to lead free glass frit powder for manufacturing a silicon solar cell, which is environmental friendly and improves the performance of a solar cell, its producing method, a metal paste composition comprising the same and a silicon solar cell.

2. Description of the Related Art

Recently, it is expected that conventional energy sources such as oil or charcoal will be exhausted, and thus interests in alternative energy source are increasing. Among alternative energy source, a solar cell has abundant energy sources and does not cause environmental pollution, and thus it becomes the object of attention.

The solar cell is classified into a solar heat cell that produces vapor required to run a turbine using solar heat, and a solar light cell that converts photons into electrical energy using properties of a semiconductor. Generally, the solar light cell is represented as a solar cell.

The solar cell largely includes a silicon solar cell, a compound semiconductor solar cell and a tandem solar cell according to raw material. Among them, the silicon solar cell leads the solar cell market.

FIG. 1 is a schematic cross-sectional, view illustrating a basic structure of a silicon solar cell. Referring to FIG. 1, the silicon solar cell includes a substrate 101 of a p-type silicon semiconductor, and an emitter layer 102 of an n-type silicon semiconductor. A p-n junction is formed at an interface between the substrate 101 and the emitter layer 102 in the similar way to a diode.

When light falls on a solar cell of the above-mentioned structure, electrons and electron holes create in a silicon semiconductor doped with an impurity by the photovoltaic effect. Specifically, electrons create in the emitter layer 102 of an n-type silicon semiconductor as a plurality of carriers, and electron holes create in the substrate 101 of a p-type silicon semiconductor as a plurality of carriers. The electrons and electron holes created by the photovoltaic effect are drawn toward the n-type silicon semiconductor and p-type silicon semiconductor, and move to a front electrode 103 on the emitter layer 102 and a rear electrode 104 below the substrate 101, respectively. When the front electrode 103 and the rear electrode 104 are connected to each other, electrical current flows.

A front electrode of a silicon solar cell is formed through an interface reaction between a metal paste for forming a front electrode and an anti-reflection film. Specifically, while silver contained in a metal paste becomes liquid at high temperature and then is recrystallized into a solid again, a front electrode is contacted with an emitter layer due to a punch-through phenomenon that the front electrode penetrates through an anti-reflection film through the medium of glass frit powder. The definite mechanism is disclosed in J. Hoomstra, et al., 31st IEEE PVSC Florida 2005.

The glass frit powder carries out an interface reaction with an anti-reflection film to etch the anti-reflection film. This is an oxidation-reduction reaction that a portion of elements is reduced and generated as a by-product. Conventionally, because glass frit powder contains lead oxide (PbO) as a main component, lead is reduced after an interface reaction and it causes environmental problems.

To solve this drawback, lead free glass frit powder containing bismuth oxide ($Bi_2O_3$) instead of lead oxide has been introduced. However, the bismuth oxide-based glass frit powder has lower contact resistance between an electrode and a substrate than conventional glass frit powder containing lead oxide.

Therefore, there is an urgent need for glass frit powder that is more environmentally friendly and can be used to manufacture solar cells of better performance than the conventional glass frit powder.

SUMMARY OF THE INVENTION

The present invention is designed to solve the problems of the prior art, and therefore it is an object of the present invention to provide lead free glass frit powder for manufacturing a silicon solar cell, which is capable of manufacturing a solar cell with lower contact resistance and higher contact strength between a substrate and an electrode than conventional glass frit powder, its producing method, a metal paste composition comprising the same and a silicon solar cell.

To achieve the object, lead free glass frit powder for manufacturing a silicon solar cell according to the present invention comprises $Bi_2O_3$; $B_2O_3$; and any one metal oxide selected from the group consisting of ZnO, $Al_2O_3$ and $BaCO_3$, or mixtures thereof. The glass frit powder of the present invention is free of lead, and consequently, if is environmental friendly. And, the glass frit powder comprises a specific metal oxide, so that it can improve the performance of a solar cell manufactured using the glass frit powder.

For example, the above-mentioned lead free glass frit powder for manufacturing a silicon solar cell according to the present invention may comprise 75 to 95 weight % of the $Bi_2O_3$, 1 to 15 weight % of the $Bi_2O_3$, and 1 to 20 weight % of any one metal oxide selected from the group consisting of ZnO, $Al_2O_3$ and $BaCO_3$, or mixtures thereof, however the present invention is not limited in this regard.

In addition, to achieve the object, a producing method of lead free glass frit powder for manufacturing a silicon solar cell according to the present invention comprises (S1) preparing constituents to produce glass frit powder, including $Bi_2O_3$; $B_2O_3$; and any one metal oxide selected from the group consisting of ZnO, $Al_2O_3$ and $BaCO_3$, or mixtures thereof; (S2) melting the prepared constituents together; (S3) cooling the melted mixture to form glass frit in a solid phase; and (S4) pulverizing the solid-phase glass frit into a powder phase.

In the producing method of the present invention, the melting process of the step (S2) may have a melting temperature of 900 to 1500° C., however the present invention is not limited in this regard.

The above-mentioned lead free glass frit powder may be used to prepare a metal paste composition together with silver powder and an organic binder, and the metal paste composition may be used to form a front electrode of a silicon solar cell.

DESCRIPTION OF THE PREFERRED EMBODIMENT

Figure 1:
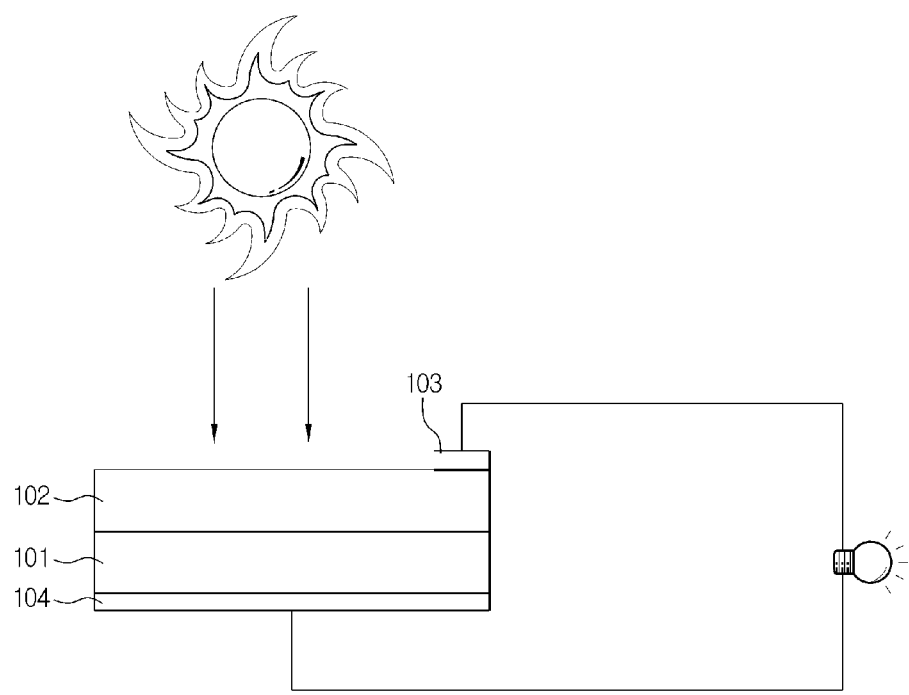
FIG. 1 is a schematic cross-sectional view of a conventional silicon solar cell.

Hereinafter, glass frit powder of the present invention will be described in detail according to its producing method. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation.

First, constituents to produce glass frit powder are prepared, including $Bi_2O_3$; $B_2O_3$; and any one metal oxide selected from the group consisting of ZnO, $Al_2O_3$ and $BaCO_3$, or mixtures thereof (S1).

$Bi_2O_3$ reacts with an anti-reflection film at high temperature and etches the anti-reflection film so as to form a front electrode of a solar cell. For example, in the case that an anti-reflection film is a silicon nitride film ($SiN_x$), an interface reaction between $Bi_2O_3$ and the anti-reflection film occurs at high temperature as follows.

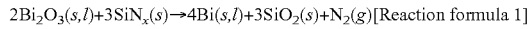
$$2Bi_2O_3(s,l)+3SiN_x(s)\rightarrow 4Bi(s,l)+3SiO_2(s)+N_2(g) \text{[Reaction formula 1]}$$

As seen in the reaction formula 1, when a portion of a silicon nitride film reacts with $Bi_2O_3$, the silicon nitride film is etched through oxidation-reduction, and silver in the metal paste is recrystallized at the etched portion to form a front electrode.

$Bi_2O_3$ according to the present invention is a main constituent of the glass frit powder replacing lead oxide, and thus, its content occupies a majority of the glass frit powder and may be properly selected with reference to the content of lead oxide used conventionally, tor example, the content of $Bi_2O_3$ may be 75 to 95 weight % based on the total weight of the glass frit powder, however the present invention is not limited in this regard. The above-mentioned content range leads to a very low contact resistance between a substrate and an electrode and a very high FF (Fill Factor) value.

$B_2O_3$ is a constituent of the glass frit powder for forming a stable glass phase. In the glass frit powder of the present invention, the content of $B_2O_3$ may be properly selected according to necessity, for example 1 to 15 weight %, however the present invention is not limited in this regard. The above-mentioned content range allows to maintain a sufficiently low viscosity during the interface reaction.

In addition to $Bi_2O_3$ and $B_2O_3$, the glass frit powder of the present invention further comprises at least one metal oxide selected from the group consisting of ZnO, $Al_2O_3$ and $BaCO_3$. The exemplary ZnO, $Al_3O_3$ and $BaCO_3$ form a stable glass phase during an interface reaction and maintain a low viscosity. If a glass component has a low viscosity during an interface reaction, they increase the contact possibility between $Bi_2O_3$ and an anti-reflection film, so that etching may occur at more areas. As mentioned above, if etching occurs at relatively more areas, a front electrode formed by recrystallization of silver has a wider area, and consequently, contact resistance between a substrate and an electrode becomes lower than conventional glass frit powder, resulting in better performance of a solar cell, and contact strength between a substrate and an electrode is improved.

In the glass frit powder of the present invention, the content of any one metal oxide selected from the group consisting of ZnO, $Al_2O_3$ and $BaCO_3$ or mixtures thereof may be properly selected through repetitive experiments according to purpose of use and aim of a solar cell. For example, the content may be 1 to 20 weight %, however the present invention is not limited in this regard. The above-mentioned content range allows to maintain a sufficiently low viscosity during an interface reaction and to ensure a very low contact resistance and a very high contact strength between a substrate and a front electrode.

Typically, in addition to the above-mentioned constituents, glass frit powder may further comprise, for example, $SiO_2$, however the present invention is not limited in this regard.

As mentioned above, after the constituents of the glass frit powder of the present invention are prepared, the constituents are melted together (S2).

When the constituents of the glass frit powder are melted together under atmospheric pressure, a bond between molecules in each constituent is broken, and consequently, each constituent loses the properties as metal oxide. Each constituent is uniformly mixed in the melted state, and wholly obtains the properties of hyaline through a subsequent cooling process.

In the melting process of the present invention, the present invention is not limited to a specific melting temperature if it can melt all constituents. For example, the melting temperature may be 900 to 1500° C., however the present invention is not limited in this regard. The above-mentioned constituents can be sufficiently melted at the above-mentioned temperature range.

The present invention is not limited to a specific melting time, during which the above-mentioned melting temperature is maintained, if it can sufficiently melt all constituents. For example, the melting time may be 10 minutes to 1 hour, however the present invention is not limited in this regard. Each constituent can be sufficiently melted in the above-mentioned time range. If the melting temperature or melting time exceeds the above-mentioned range, additional melting effects cannot be expected.

Subsequently, the melted mixture is cooled to form a glass frit in a solid phase (S3).

The melted constituents are cured through a cooling process to form a glass frit in a solid phase. The cooling rate may be properly selected according to the kind of constituents of a glass frit, however it is generally preferable to cool the constituents at a high rate. The definite cooling conditions may be determined with reference to the phase diagram of each constituent. For example, the melted mixture may be cooled down to 25 to 50° C. under atmospheric pressure for 1 to 5 minutes, however the present invention is not limited in this regard. If the cooling rate does not satisfy the above-mentioned range, crystallization occurs during cooling, thereby failing to form a glass phase.

Typical methods in the art may be used without limit to accomplish the above-mentioned cooling rate. For example, the melted mixture may be extruded in plate form to increase the surface area or may be dipped into water, however the present invention is not limited in this regard.

Next, the solid-phase glass frit is pulverized into a powder phase (S4).

The solid-phase glass frit has too large volume to be mixed in a metal paste, and accordingly it is preferable to pulverize the solid-phase glass frit into a powder phase. After pulverization, an average particle size of the powder may be that of conventional glass frit powder in the art, for example 1 to 10 μm (micrometer), however the present invention is not limited in this regard. The above-mentioned average particle size range allows a relatively uniform dispersion in a metal paste, thereby bringing about an interface reaction very effectively.

Typical methods in the art may be used without limit to pulverize the solid-phase glass frit after cooling into a powder phase. For effective pulverization, a two-step method may be used. In this case, the same pulverizing step may be repeated twice. Alternatively, a first pulverizing step and a second pulverizing step may be performed, wherein the first pulverizing step is coarse pulverization and the second pulverizing step is fine pulverization. Here, the coarse pulverization is not limited to pulverization of the solid-phase glass frit into a powder phase of a specific average particle size, but pulverization into a powder phase of a proper average particle size for easy fine pulverization using a fine pulverization method. And, the fine pulverization is pulverization of the coarsely pulverized glass frit into powder of a desired average particle size.

And, the pulverizing process may be selected from dry pulverization or wet pulverization according to necessity. In the case of wet pulverization, water or ethanol may be added, as well known in the art, however the present invention is not limited in this regard.

Figure 2:
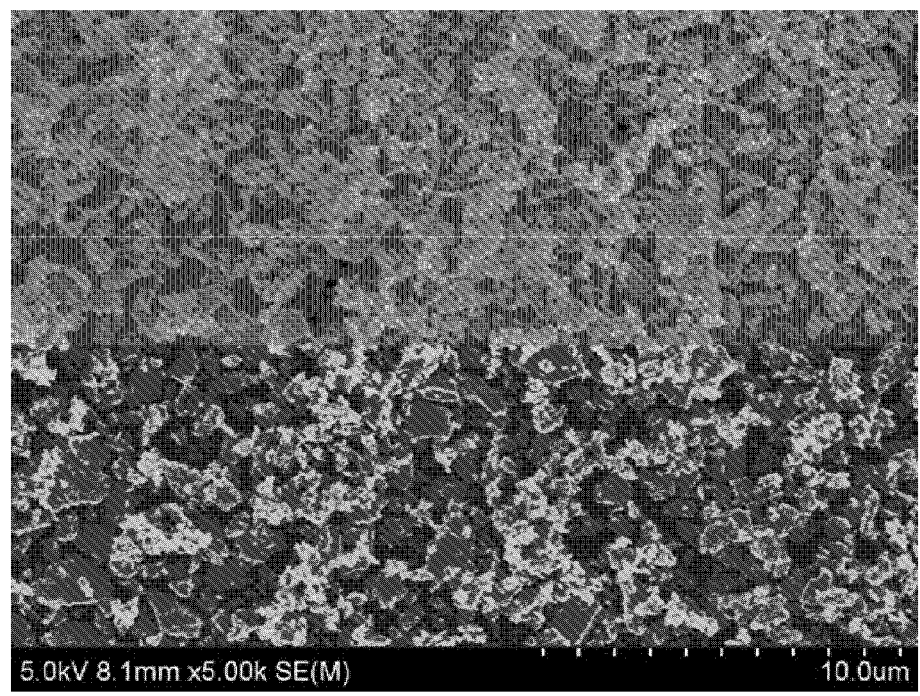
FIG. 2 is an SEM (Scanning Electron Microscopy) image of glass frit powder according to example 1 of the present invention.

FIG. 2 is an SEM image of glass frit powder according to an example of the present invention.

The glass frit powder produced by the above-mentioned producing method may be included in a metal paste composition for forming a front electrode of a silicon solar cell. The metal paste composition of the present invention comprises the above-mentioned glass frit powder, silver powder and an organic binder.

A mixing ratio of the glass frit power and the silver powder may be properly selected depending on the manufacturing conditions. For example, the glass frit power may be included at an amount of 1 to 20 parts by weight based on 100 parts by weight of the silver powder. When the content of the glass frit powder is within the above-mentioned range, an interface reaction sufficiently occurs and an excessive interface reaction is suppressed, thereby preventing junction breakdown in a solar cell.

The organic binder makes the glass frit powder and the silver powder into a paste phase. The resulting mixture is agitated to be uniformly dispersed.

The present invention is not limited to a specific organic binder if it is used typically in the art to prepare a metal paste composition for forming a front electrode of a solar cell. For example, the organic binder may be ay one selected from the group consisting of cellulose, butyl carbitol and terpineol, or mixtures thereof, however the present invention is not limited in this regard.

Here, the content of the organic binder may be properly selected depending on the manufacturing conditions. For example, the organic binder may be included at an amount of 5 to 30 parts by weight based on 100 parts by weight of the silver powder in the paste. The above-mentioned content range of the organic binder allows a suitable viscosity for screen printing and a suitable aspect ratio obtained by preventing overflow of the paste after screen printing.

Through the above-mentioned process, a metal paste composition for forming a front electrode of a silicon solar cell, comprising silver powder, glass frit, powder and an organic binder, is prepared.

The present invention provides a silicon solar cell manufactured using the metal paste composition of the present invention.

Figure 3:
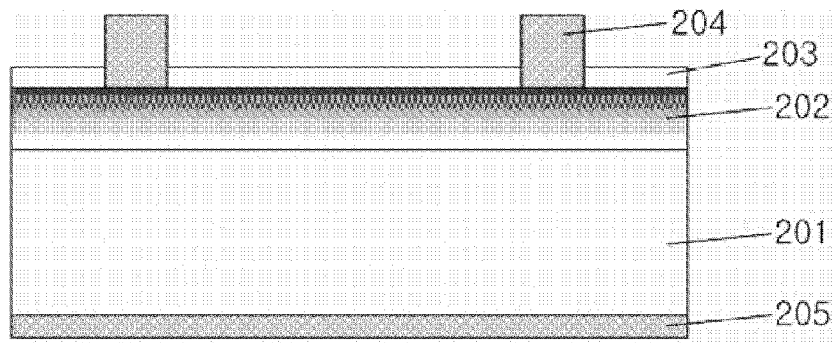
FIG. 3 is a cross-sectional view of a silicon solar cell according to an embodiment of the present invention.

FIG. 3 is a schematic cross-sectional view of a silicon solar cell according to a preferred embodiment of the present invention.

Referring to FIG. 3, the silicon solar cell of the present invention comprises a silicon semiconductor substrate 201, an emitter layer 202 formed on the substrate 201, an anti-reflection film 203 formed on the emitter layer 202, a front electrode 204 connected with an upper surface of the emitter layer 202 by penetrating through the anti-reflection film 203, and a rear electrode 205 connected with a rear surface of the substrate 201.

The substrate 201 may be doped with a p-type impurity such as third group elements in the periodic; table including B, Ga, In and so on, and the emitter layer 202 may be doped with an n-type impurity such as fifth group elements in the periodic table including P, As, Sb and so on. When the substrate 201 and the emitter layer 202 are doped with impurities of the opposite conductivity as mentioned above, a p-n junction is formed at an interface between the substrate 201 and the emitter layer 202. Meanwhile, a p-n junction may be formed at an interface between the substrate 201 doped with an n-type impurity and the emitter layer 202 doped with a p-type impurity.

The anti-reflection film 203 passivates defects (for example, dangling bond) on the surface or in the bulk of the emitter layer 202 and reduces the reflectivity of solar lights incident on a front surface of the substrate 201. When defects existing in the emitter layer 202 are passivated, recombination sites of minority carriers are eliminated and an open-circuit voltage of a solar cell increases. The reduction in reflectivity of solar lights increases the amount of lights reaching a p-n junction, thereby increasing the short-circuit current of a solar cell. The increase in open-circuit voltage and short-circuit current improves the conversion efficiency of a solar cell as much.

For example, the anti-reflection film 203 may have a single film structure of any one selected from the group consisting of a silicon nitride film, a silicon nitride film containing hydrogen, a silicon oxide film, a silicon oxidized nitride film, MgF, ZnS, MgF, TiO and CeO, or a multiple film structure of at least two material films, however the present invention is not limited in this regard. The anti-reflection film 203 may be formed by vacuum deposition, chemical vapor deposition, spin coating, screen printing or spray coating. However, the present invention is not limited to a specific method for forming the anti-reflection film 203.

The front electrode 204 and the rear electrode 205 are metal electrodes made from silver and aluminum, respectively. However, the present invention is not limited to a specific kind of electrode material. A silver electrode has good electrical conductivity, and an aluminum electrode has good electrical conductivity and excellent affinity for the substrate 201 made from a silicon semiconductor, resulting in good bonding with the substrate 201.

The front electrode 204 and the rear electrode 205 can be formed by various well-known techniques, however may be preferably formed through screen printing. That is, the front electrode 204 is formed by screen printing the above-mentioned paste for forming a front electrode at an area where the front electrode 204 will be located, and thermally treating the paste. During the thermal treatment, the front electrode 204 penetrates through the anti-reflection film 203 due to a punch-through phenomenon, and is connected with the emitter layer 202.

Similarly, the rear electrode 205 is formed by printing a paste for forming a rear electrode, comprising aluminum, quartz silica, a binder and so on, on the rear surface of the substrate 201, and thermally treating the paste. During the thermal treatment, aluminum that is one of materials used in forming a rear electrode, diffuses through the rear surface of the substrate 201, so that a back surface field (not shown) layer may be formed at an interface between the rear electrode 205 and the substrate 201. The back surface field layer prevents carriers' movement to the rear surface of the substrate 201 and recombination. Prevention of carriers' recombination results in increased open-circuit voltage and fill factor, and consequently improved conversion efficiency of a solar cell.

The present invention is not limited to a specific process for forming the front electrode 204 and the rear-electrode 205. For example, the front electrode 204 and the rear electrode 205 may be formed by typical photolithography and metal deposition other than screen printing.

Hereinafter, the present invention will be described in detail through specific examples. However, the description proposed herein is just a preferable example for the purpose of illustrations only, not intended to limit the scope of the invention, so it should be understood that the examples are provided for a more definite explanation to an ordinary person skilled in the art.

Example 1

29 g of $Bi_2O_3$, 2 g of $B_2O_3$, 2 g of ZnO and 2 g of $BaCO_3$ were mixed, and the mixture was melted at 1200° C. for 20 minutes. The resultant melted product was extruded in plate form and cooled down to 25° C. over 5 minutes. The resultant cooled product was pulverized by a pulverizer to produce glass frit powder.

7 g of the produced glass frit powder and 40 g of silver powder were mixed and agitated uniformly, and added with 10 g of an organic binder of cellulose, butyl carbitol and terpineol at a mixing weight ratio of 2:5:5, and agitating them to prepare a metal paste composition.

Using the metal paste composition, a silicon solar cell was manufactured, comprising an aluminum rear electrode, a p-type silicon semiconductor substrate, an n-type emitter layer, a silicon nitride film as an anti-reflection film and a front electrode.

Example 2

Glass frit powder, a metal paste composition and a solar cell were manufactured in the same way as example 1, except that 35 g of $Bi_2O_3$, 2 g of $B_2O_3$, 2 g of ZnO and 1 g of $Al_2O_3$ were mixed.

Example 3

Glass frit powder, a metal paste composition and a solar cell were manufactured in the same way as example 1, except that 35 g of $Bi_2O_3$, 5 g of $B_2O_3$ and 4 g of ZnO were mixed.

Example 4

Glass frit powder, a metal paste composition and a solar cell were manufactured in the same way as example 1, except that 35 g of $Bi_2O_3$, 2 g of $B_2O_3$, 2 g of $BaCO_3$ and 1 g of $Al_2O_3$ were mixed.

Example 5

Glass frit powder, a metal paste composition and a solar cell were manufactured in the same way as example 1, except that 39 g of $Bi_2O_3$, 4 g of $B_2O_3$ and 7 g of $Al_2O_3$ were mixed.

Example 6

Glass frit powder, a metal paste composition and a solar cell were manufactured in the same way as example 1, except that 38 g of $Bi_2O_3$, 7 g of $B_2O_3$ and 5 g of $BaCO_3$ were mixed.

Comparative Example 1

Glass frit powder, a metal paste composition and a solar cell were manufactured in the same way as example 1, except that 28 g of $Bi_2O_3$, and 2 g of $SiO_2$ were mixed.

The solar cells of examples 1 to 6 and comparative example 1 were tested for FF, and the results are shown in Table 1.

TABLE 1

| D | Example 1 | Example 2 | Example 3 | Example 4 | Example 5 | Example 6 | Comparative example 1 |
|---|---|---|---|---|---|---|---|
| FF | 76.0% | 77.0% | 75.0% | 74.0% | 73.0% | 74.0% | 65.0% |

Experimental Example

1. SEM Measurement

An SEM image of the glass frit powder of example 1 is shown in FIG. 2. It is found from FIG. 2 that the glass frit, powder of example 1 has uniformity.

Figure 4:
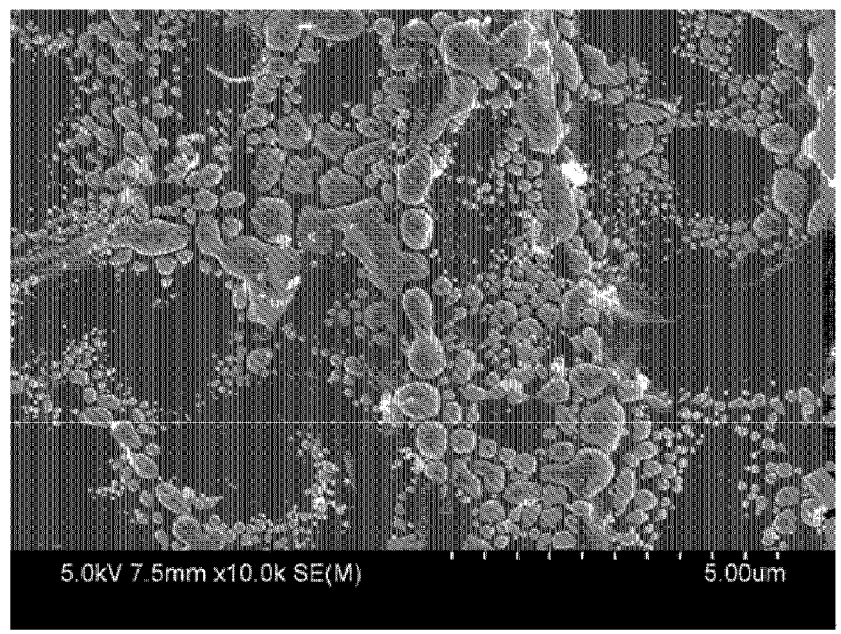
FIG. 4 is an SEM image of a front electrode according to example 1 of the present invention.

FIG. 4 shows an SEM image of recrystallization of silver in a front electrode formed using the metal paste composition of example 1. It is found from FIG. 4 that silver is recrystallized over a wide area.

2. Peeling Test

Figure 5:
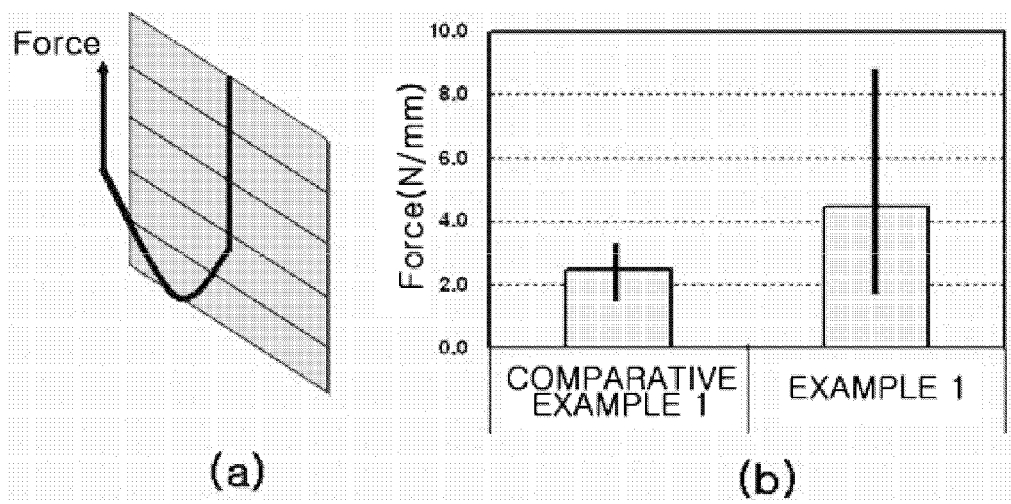
FIG. 5(a) is a view illustrating a peeling test.
FIG. 5(b) is a graph illustrating the peeling test results of front electrodes according to comparative example 1 and example 1.

A peeling test (ASTM D1876) was made on the front, electrodes of example 1 and comparative example 1 so as to measure the adhesive strength of the front electrode formed according to the present invention, and the results are shown in FIG. 5.

As shown in FIG. 5, it is found that the front electrode of example 1 has excellent adhesive strength.

INDUSTRIAL APPLICABILITY

The lead-free glass frit powder for manufacturing a silicon solar cell according to the present invention contains bismuth oxide instead of lead oxide, and accordingly, it is more environmental friendly than lead-based glass frit powder in a producing process or subsequent use. And, a silicon solar cell manufactured using the glass frit powder of the present invention has low contact resistance and high contact strength between a substrate and an electrode, and consequently excellent performance and durability.

What is claimed is:

1. A metal paste composition for manufacturing a front electrode of a silicon solar cell, comprising:
a silver powder, a glass frit powder, and an organic binder, wherein the glass frit powder is lead free glass frit powder consisting of: 75 to 95 weight % of $Bi_2O_3$; 1 to 15 weight % of $B_2O_3$; and 1 to 20 weight % of at least two metal oxides selected from the group consisting of ZnO, $Al_2O_3$ and BaO, and wherein the glass frit powder is included at an amount of 1 to 20 parts by weight based on 100 parts by weight of the silver powder.

2. A metal paste composition for manufacturing a front electrode of a silicon solar cell according to claim 1, wherein the glass frit powder has an average particle size of 1 to 10 μm (micrometer).

\* \* \* \* \*